(12) United States Patent
Hsu

(10) Patent No.: US 6,500,024 B2
(45) Date of Patent: Dec. 31, 2002

(54) CIRCUIT PROTECTION MECHANISM FOR CPU SOCKET

(75) Inventor: Hsien-Yueh Hsu, Taipei (TW)

(73) Assignee: ASUSTek Computer Inc., Taipei (TW)

( * ) Notice: Subject to any disclaimer, the term of this patent is extended or adjusted under 35 U.S.C. 154(b) by 0 days.

(21) Appl. No.: 09/991,698

(22) Filed: Nov. 26, 2001

(65) Prior Publication Data

US 2002/0067600 A1 Jun. 6, 2002

(30) Foreign Application Priority Data

Dec. 6, 2000 (TW) ........................................ 89126032 A

(51) Int. Cl.$^7$ ............................................. H01R 13/625
(52) U.S. Cl. ........................................... 439/485; 439/70
(58) Field of Search ................................ 439/485, 486, 439/487, 70, 71, 72, 73

(56) References Cited

U.S. PATENT DOCUMENTS

| | | | | |
|---|---|---|---|---|
| 5,241,453 A | * | 8/1993 | Bright et al. ............... | 361/704 |
| 5,282,111 A | * | 1/1994 | Hopfer ....................... | 361/704 |
| 5,302,853 A | * | 4/1994 | Volz et al. .................. | 257/707 |
| 5,602,719 A | * | 2/1997 | Kinion ....................... | 361/704 |
| 6,071,128 A | * | 6/2000 | Brewington et al. .......... | 439/73 |
| 6,226,185 B1 | * | 5/2001 | Lin ............................ | 361/704 |
| 6,295,203 B1 | * | 9/2001 | Lo ............................. | 361/704 |
| 6,301,112 B1 | * | 10/2001 | Lee ............................ | 361/704 |
| 6,442,026 B2 | * | 8/2002 | Yamaoka .................... | 361/704 |

\* cited by examiner

*Primary Examiner*—Tulsidas Patel
(74) *Attorney, Agent, or Firm*—Rabin & Berdo, P.C.

(57) ABSTRACT

A Central Processing Unit (CPU) socket having a circuit protection mechanism electrically couples a CPU to a Printed Circuit Board (PCB). The heat sink fastener matches the supports positioned on two opposing sides of the main body for mounting the heat sink on the CPU socket tightly. The protection component protrudes the main body and covers the corresponding PCB trace under the supports to protect the PCB trace from damaged by the heat sink fastener as mounting or dismounting the heat sink on the CPU socket.

7 Claims, 6 Drawing Sheets

CIRCUIT PROTECTION MECHANISM FOR CPU SOCKET

This application incorporates by reference Taiwanese application Serial No. 89126032, Filed Dec. 6, 2000.

BACKGROUND OF THE INVENTION

1. Field of the Invention

The invention relates in general to a circuit protection mechanism, and more particularly to a circuit protection mechanism for CPU socket.

2. Description of the Related Art

Referring to FIG. 1, the traditional CPU socket on the motherboard is illustrated. The CPU socket 102 is for placing a Central Processing Unit (CPU). The CPU socket 102 electrically couples the CPU to the Printed Circuit Board (PCB). The layout of the PCB 106 arranges the PCB trace 108 around the CPU socket 102.

The speedier processing and better performance of the CPU requires higher frequency as well as higher voltage and therefore generates lots of heat. The high temperature would decrease the life span of the CPU and easily cause the instability of the computer system. All modern CPUs require a heat sink to solve this problem. The heat sink is designed to lower the temperature of the CPU by dissipating heat into the surrounding air so that the CPU can run well. As shown in FIG. 1, The supports 104 positioned on two opposing sides of the CPU socket 102 matches the heat sink fastener for mounting the heat sink on the CPU socket 102.

In order to be more efficient, the surface area of the heat sink is designed to be as big as possible that good thermal transfer is possible inside the heat sink. Hence the heat sink made up of metal is big and heavy for a better thermal conductivity. It sometimes requires strenuous effort to mounting or dismounting the heat sink on the CPU socket. However, the fixing end of the heat sink fastener might damage the PCB trace 108 on the PCB 106 and the whole motherboard is beyond repair and has to be cast away. Especially for the computer DIY user, the failure rate of the computer system is up to 10% when it comes to upgrading the CPU. The troublesome matter is that the user usually can not figure out the crux of the problem until the last minute. However, the computer system has failed and the layout on the PCB has been damaged due to improper forcing as mounting or dismounting the heat sink on the CPU socket.

SUMMARY OF THE INVENTION

It is therefore an object of the invention to provide a CPU socket having a circuit protection mechanism. The circuit of the Printed Circuit Board (PCB) is covered by the protection component. The fixing end of the heat sink fastener cannot directly touch the PCB to damage the PCB trace on the PCB as mounting or dismounting the heat sink on the CPU socket.

The invention achieves the above-identified objects by providing a Central Processing Unit (CPU) socket having a circuit protection mechanism. The CPU socket electrically couples a CPU to a Printed Circuit Board (PCB). The heat sink fastener matches the supports positioned on two opposing sides of the main body for mounting the heat sink on the CPU socket tightly. The protection component protrudes the main body and covers the corresponding PCB trace under the supports to protect the PCB trace from damaged by the heat sink fastener as mounting or dismounting the heat sink on the CPU socket. The protection component can be formed on the main body and made up of several sheets placed under the supports individually or a single sheet placed under the supports. The protection component can also be a detachable mechanism for holding and positioned around the periphery of the main body.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1:
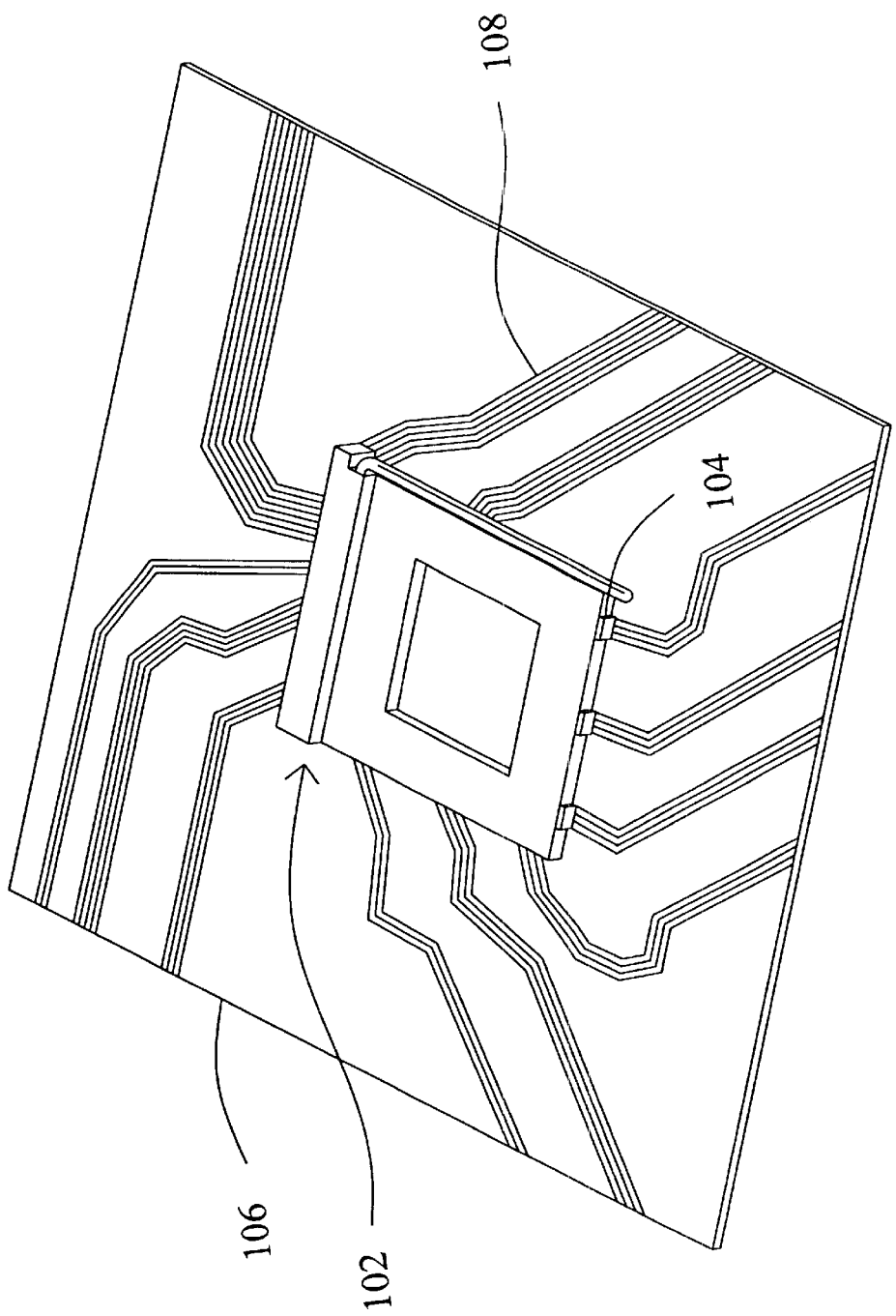
FIG. 1 (Prior Art) illustrates the traditional CPU socket on the motherboard.
Figure 2A:
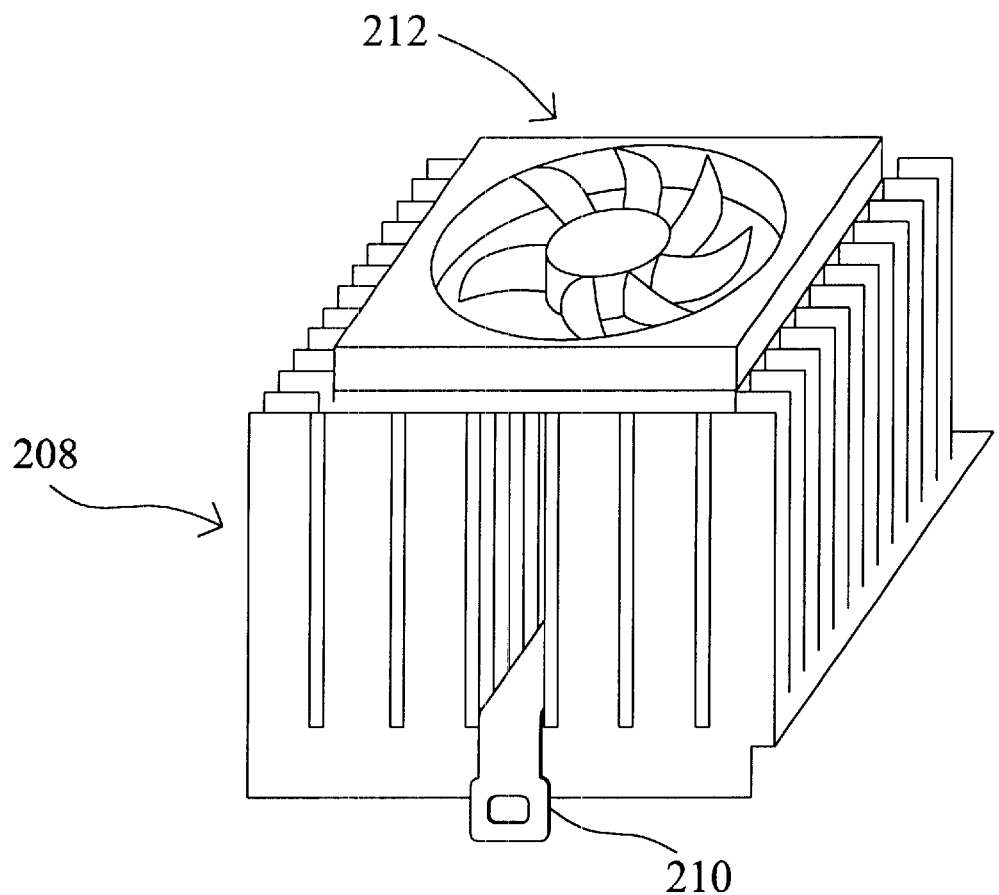
FIG. 2A shows a perspective view of a CPU socket having a circuit protection mechanism according to one preferred embodiment of the invention as well as the heat sink.
Figure 2A:
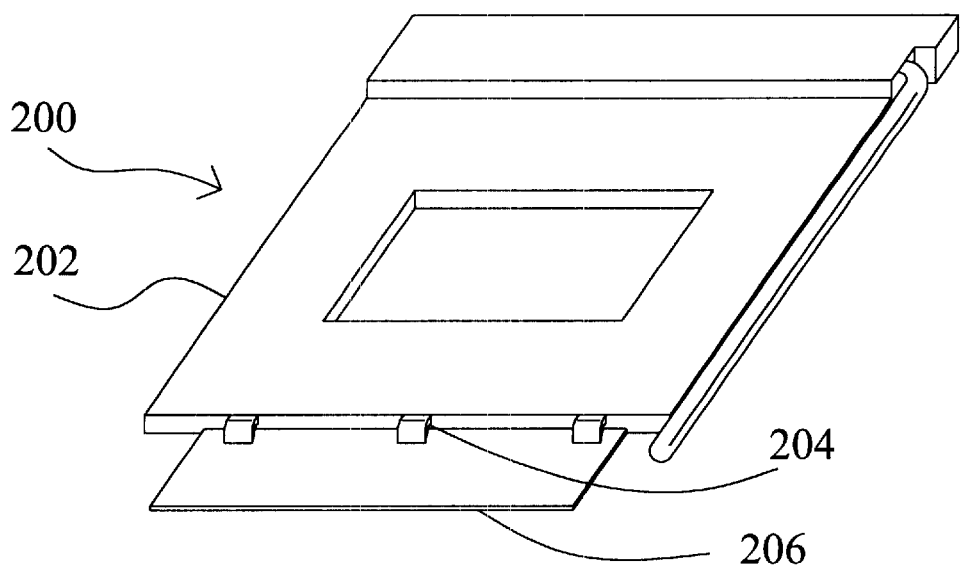
Figure 2B:
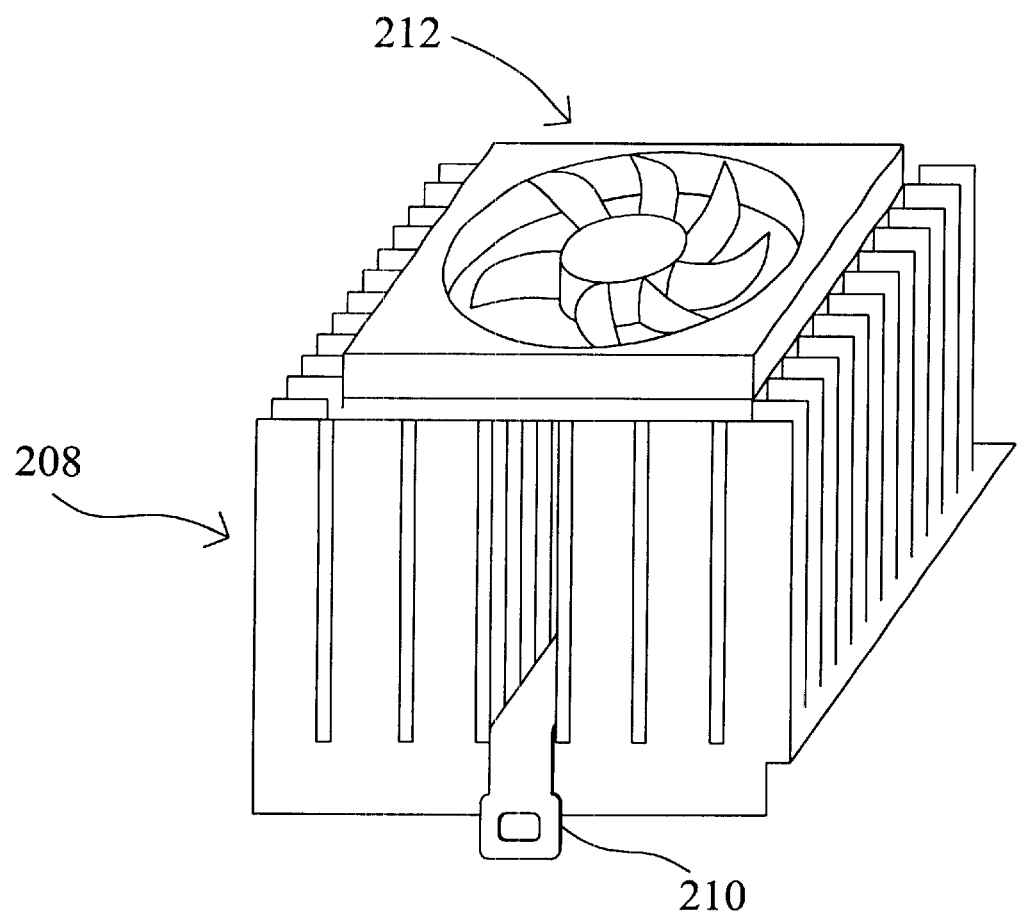
FIG. 2B shows a perspective view of a CPU socket having a circuit protection mechanism according to another preferred embodiment of the invention as well as the heat sink.
Figure 2B:
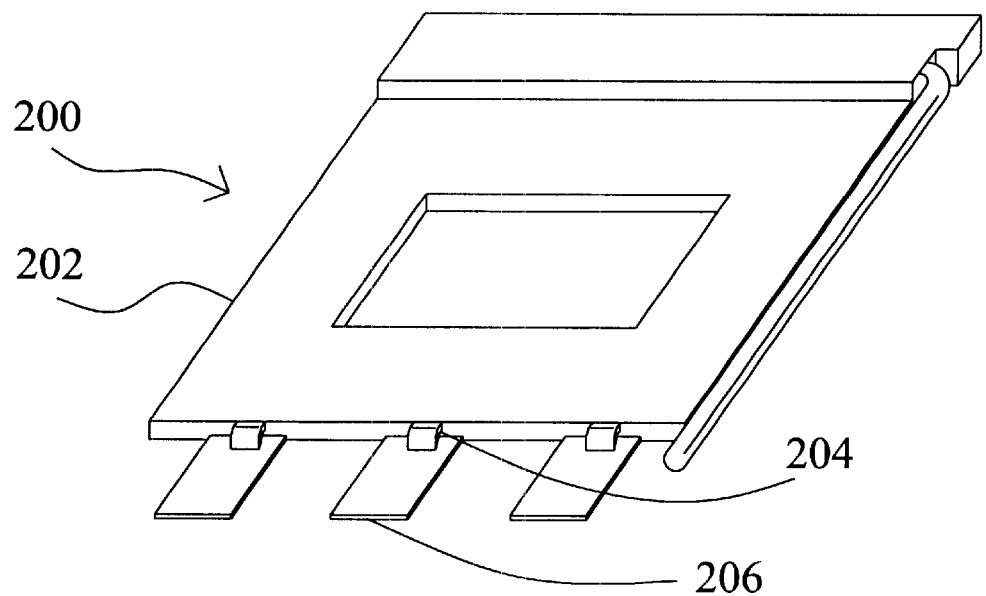
Figure 2C:
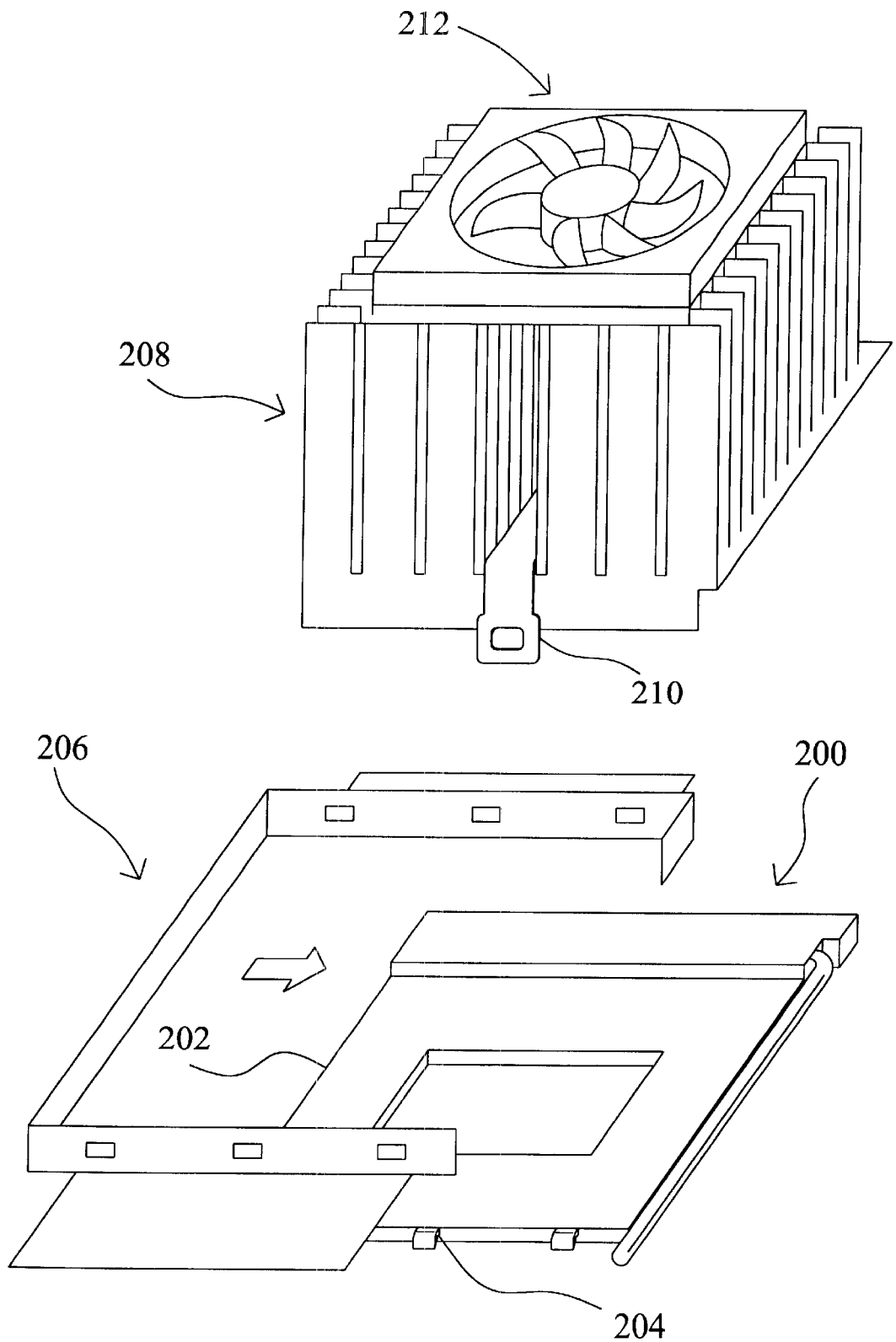
FIG. 2C shows a perspective view of a CPU socket having a circuit protection mechanism according to the other preferred embodiment of the invention as well as the heat sink.
Figure 3:
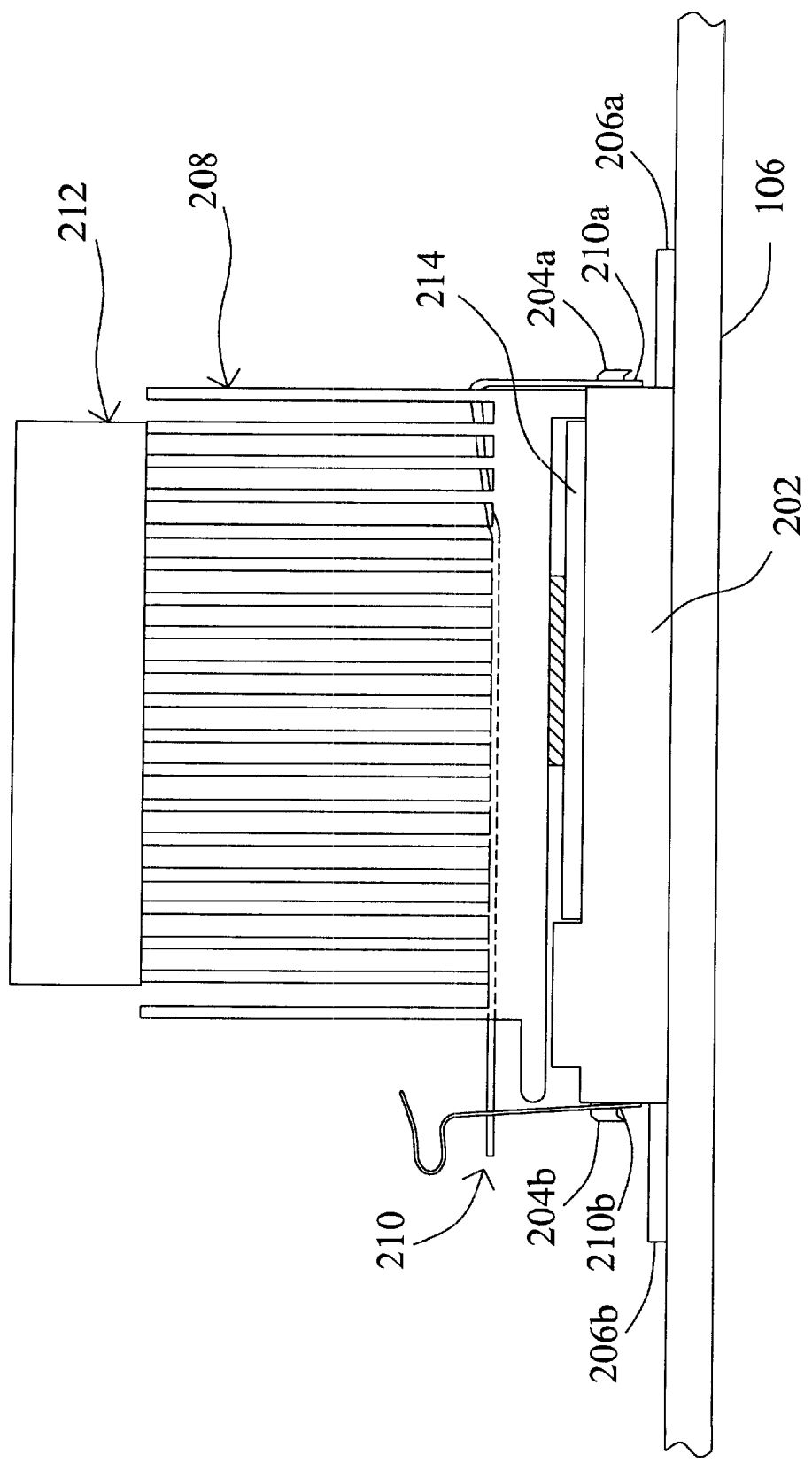
FIG. 3 shows a side, cross-sectional view of a CPU socket having a circuit protection mechanism according to the preferred embodiment of the invention, in which the heat sink is mounted on the CPU socket.

Referring first to FIGS. 2A to 2C, perspective views of the CPU socket having a circuit protection mechanism according to the preferred embodiments of the invention as well as the heat sink are shown. The heat sink fastener 210 matches the supports 204 positioned on two opposing sides of the main body 202 for mounting the heat sink 208 on the CPU socket 200 tightly. The fan 212 connects to the top of the heat sink 208. The heat generated by the CPU 214 (as shown in FIG. 3) can be conducted from the lower part of the heat sink 208, that is in contact with the CPU 214, to the fins and then dissipated into the surrounding air by the fan 212. Besides, the protection component 206 protrudes the main body 202 to cover the corresponding PCB trace 108 under the supports 204 which match the heat sink fastener. It avoids damaging the PCB trace 108 by the fixing end of the heat sink fastener 210 as mounting or dismounting the heat sink 208 on the CPU socket 200. The protection component 206 can be either formed on the main body 202 or an additional mechanism connected to the main body 202 in accordance with the molds. There are various types of the protection component 206. As shown in FIG. 2B, the protection component 206 is made up of several sheets placed under the supports 204 individually. As shown in FIG. 2A, the protection component 206 is made up of a single sheet placed under the supports 204. Moreover, the protection component 206 can also be a detachable mechanism for holding and positioned around the periphery of the main body 202. The detachable mechanism includes at least a sheet placed under the supports 204.

Referring to FIG. 3, a side, cross-sectional view of a CPU socket having a circuit protection mechanism according to the preferred embodiment of the invention, in which the heat sink is mounted on the CPU socket is shown. As shown in FIG. 3, the heat sink fastener 210 bestrides the heat sink 208 and presses the heat sink 208 onto the CPU socket 200 from both sides. The first fixing end 210a of the heat sink fastener 210 clips the support 204a on one side of the main body 202 while the second fixing end 210b of the heat sink fastener 210 clips the supports 204b on the other side of the main body 202. Since the first protection component 206a and the second protection component 206b respectively connect to the opposing sides of the main body 202 and cover the corresponding PCB trace 108 under the supports 204 which match the heat sink fastener 210. It avoids damaging the PCB trace 108 when mounting or dismounting the heat sink 208 on the CPU socket 200. Even the user inadvertently presses down on the PCB, the first fixing end 210a or the second fixing end 210b of the heat sink fastener 210 can not touch and damage the PCB trace 108.

Figure 4A:
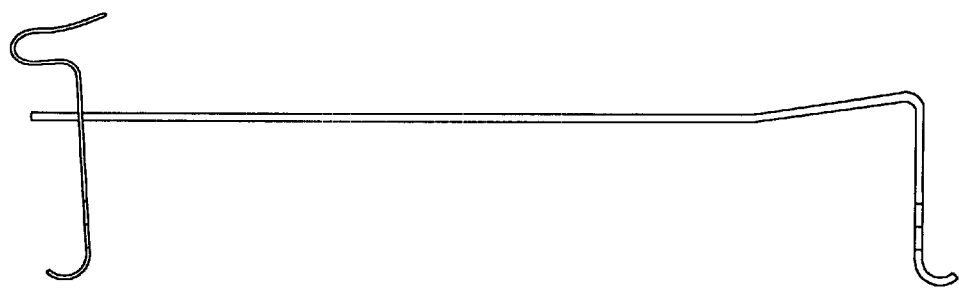
FIGS. 4A~4C shows a side view of heat sink fasteners of the embodiments of the invention.
Figure 4B:
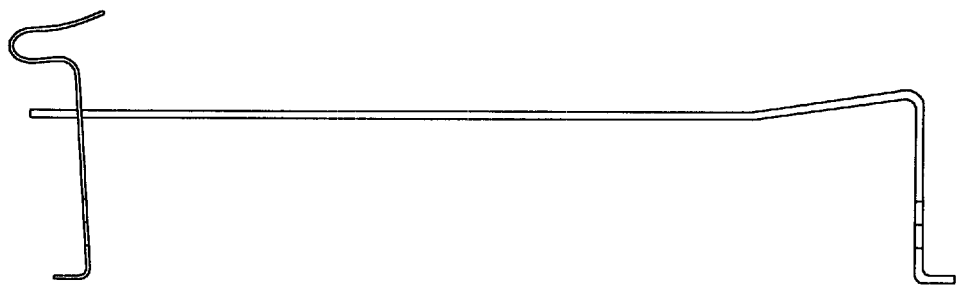
Figure 4C:
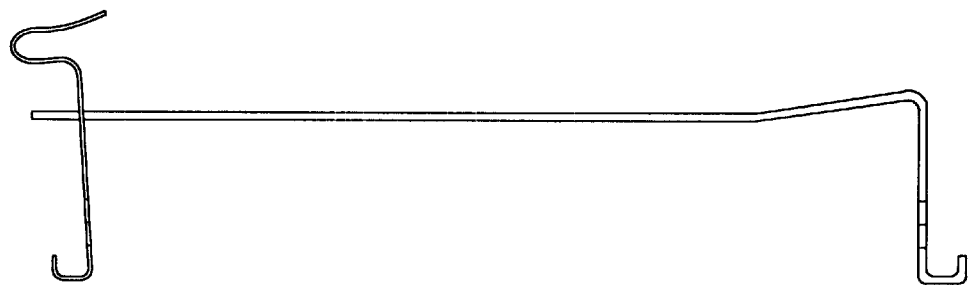

Referring to FIGS. 4A to 4C, a side view of heat sink fasteners of the embodiments of the invention is shown. In order to prevent the PCB trace 108 from damaged due to the directly touching of the first fixing end 210a or the second fixing end 210b of the heat sink fastener 210, the heat sink faster 210 itself can be designed to be smoother and duller. For example, the first fixing end 210a and the second fixing end 210b, which might touch the PCB, are turned rounded in FIG. 4A, flat in FIG. 4B or hooked in FIG. 4C.

However, the standards of the heat sink and ways to fix the heat sink on the CPU socket differ from each heat sink manufacturer. As for a motherboard manufacturer, the protruding protection component connected to the CPU socket can be designed to be an extension structure of the CPU socket and made by the same material. The protruding protection component can also be simply placed on the bottom of the CPU socket or positioned around the periphery of the main body in a detachable design.

The CPU socket having a circuit protection mechanism according to the invention efficiently decreases the failure rate of the computer system due to improper forcing as mounting or dismounting the heat sink on the CPU socket. The fixing end of the heat sink fastener can not touch and damage the PCB trace even the user inadvertently presses down on the PCB. It avoids damaging the layout of the PCB and improve the reliability and stability of the motherboard.

While the invention has been described by way of example and in terms of the preferred embodiment, it is to be understood that the invention is not limited to the disclosed embodiment. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A Central Processing Unit (CPU) socket having a circuit protection mechanism capable of electrically coupling a CPU to a Printed Circuit Board (PCB) and mounting a heat sink by a heat sink fastener; the CPU socket comprising:

a main body for connecting the CPU;

a plurality of supports positioned on two opposing sides of the main body and matching the heat sink fastener for mounting the heat sink on the CPU socket; and a protection component protruding the main body and covering at least the corresponding PCB trace under the supports which match the heat sink fastener to protect the PCB trace from damaged by the heat sink fastener as mounting or dismounting the heat sink on the CPU socket.

2. The CPU socket having a circuit protection mechanism according to claim 1, wherein the protection component is made up of a plurality of sheets placed under the supports individually.

3. The CPU socket having a circuit protection mechanism according to claim 1, wherein the protection component is made up of a single sheet placed under the supports.

4. The CPU socket having a circuit protection mechanism according to claim 1, wherein the protection component is formed on the main body.

5. The CPU socket having a circuit protection mechanism according to claim 1, wherein the protection component is a detachable mechanism for holding.

6. The CPU socket having a circuit protection mechanism according to claim 5, wherein the detachable mechanism for holding is positioned around the periphery of the main body.

7. The CPU socket having a circuit protection mechanism according to claim 6, wherein the detachable mechanism for holding comprises at least a sheet placed under the supports.

* * * * *